(12) United States Patent
Endo et al.

(10) Patent No.: US 6,902,999 B2
(45) Date of Patent: Jun. 7, 2005

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 10/438,859

(22) Filed: May 16, 2003

(65) Prior Publication Data

US 2003/0224589 A1 Dec. 4, 2003

(30) Foreign Application Priority Data

May 22, 2002 (JP) ....................................... 2002-147330

(51) Int. Cl.[7] .......................................... H01L 21/4763
(52) U.S. Cl. ...................................................... 438/619
(58) Field of Search ................................ 438/619, 552

(56) References Cited

U.S. PATENT DOCUMENTS 6,306,754 B1 * 10/2001 Agarwal ..................... 438/619
6,379,874 B1    4/2002 Ober et al.
6,656,666 B2 * 12/2003 Simons et al. ............... 430/322

FOREIGN PATENT DOCUMENTS

JP          P2002-76116 A        3/2002

* cited by examiner

*Primary Examiner*—David Nelms
*Assistant Examiner*—Thao P. Le
(74) *Attorney, Agent, or Firm*—McDermott Will & Emery LLP

(57) ABSTRACT

After flattening a surface of an underlying film that has pores or includes an organic material by treating the underlying film in a supercritical fluid, a resist film made of a chemically amplified resist material is formed on the underlying film whose surface has been flattened. Next, pattern exposure is performed by selectively irradiating the resist film with exposing light, and then, the resist film is developed after the pattern exposure, so as to form a resist pattern.

20 Claims, 6 Drawing Sheets

PATTERN FORMATION METHOD

BACKGROUND OF THE INVENTION

The present invention relates to a pattern formation method for use in fabrication processing or the like for a semiconductor integrated circuit device.

In the fabrication processing for a semiconductor integrated circuit device or the like, the size of a resist pattern (pattern width) formed by lithography technique is further refined in accordance with increase in the degree of integration of semiconductor integrated circuits, and accordingly, the aspect ratio of a resist pattern is remarkably increasing.

Also, the dielectric constant of an insulating film is desired to be further lowered in accordance with improved performance of semiconductor devices. Therefore, use of a low dielectric insulating film that has a lower dielectric constant than a generally used silicon oxide film, such as an insulating film having pores or including an organic material, has been proposed.

Now, a conventional pattern formation method will be described with reference to FIGS. 6A through 6D.

First, a chemically amplified resist material having the following composition is prepared:

| | |
|---|---|
| Base polymer: poly((methoxymethyl acrylate) – (γ-butyrolactone methacrylate)) (wherein methoxymethyl acrylate:γ-butyrolactone methacrylate = 70 mol %:30 mol %) | 2 g |
| Acid generator: triphenylsulfonium triflate | 0.04 g |
| Solvent: propylene glycol monomethyl ether acetate | 20 g |

Next, an organic polymer made of aromatic hydrocarbon including no fluorine (for example, SiLK manufactured by Hitachi Chemical Co., Ltd. (with a dielectric constant of 2.65)) is deposited on a substrate 1 so as to form a low dielectric insulating film 2. Thereafter, the chemically amplified resist material having the aforementioned composition is applied on the low dielectric film 2, and then, the resultant substrate 1 is annealed with a hot plate (not shown) at a temperature of 90° C. for 60 seconds. Thus, a resist film 3 with a thickness of 0.4 μm is formed.

Next, as shown in FIG. 6B, pattern exposure is carried out by irradiating the resist film 3 with ArF excimer laser 5 through a photomask 4 having a desired pattern.

Then, as shown in FIG. 6C, the resist film 3 is subjected to post-exposure bake (PEB) by annealing the substrate 1 with a hot plate (not shown) at a temperature of 105° C. for 90 seconds. Thus, an exposed portion 3a of the resist film 3 becomes soluble in an alkaline developer because an acid is generated from the acid generator therein while an unexposed portion 3b of the resist film 3 remains insoluble in an alkaline developer because no acid is generated from the acid generator therein.

Next, after the pattern exposure, the resist film 3 is developed with an alkaline developer of a 2.38 wt % tetramethylammonium hydroxide aqueous solution for 60 seconds and is then rinsed with pure water for 60 seconds. Thereafter, the resultant resist film 3 is dried. Thus, a resist pattern 6 with a pattern width of 0.11 μm is formed from the unexposed portion 3b of the resist film 3 as shown in FIG. 6D.

The cross-sectional shape of the resist pattern 6 has, however, a footing shape as shown in FIG. 6D, and thus, the pattern shape is defective.

The conventional pattern formation method shown in FIGS. 6A through 6D is employed for forming a positive resist pattern 6. In the case where a negative resist pattern is formed, the resultant resist pattern has an undercut cross-sectional shape, and the pattern shape is also defective.

When a resist pattern in a defective pattern shape is used for etching a film to be etched, the shape of the resultant pattern of the etched film is also defective, which disadvantageously lowers the yield of semiconductor devices.

SUMMARY OF THE INVENTION

In consideration of the aforementioned conventional disadvantage, an object of the invention is forming a resist pattern in a good pattern shape.

In order to achieve the object, the present inventors have made a variety of examinations on the cause of the defective shape of a resist pattern. As a result, it has been found that in the case where an underlying film has pores or includes an organic material, the shape of a resultant resist pattern formed thereon becomes defective.

Also, the reason why a resist pattern formed on an underlying film having pores or including an organic material becomes defective has been studied, resulting in finding the following phenomenon: When a resist film made of a chemically amplified resist material is formed on a low dielectric insulating film, such as a porous film having pores or an organic film having a rough surface because of an organic material included therein, and is subjected to pattern exposure, an acid generated in an exposed portion of the resist film is incorporated in the pores or recesses of the rough surface of the underlying film. As a result, the amount of acid is so insufficient at the bottom of the exposed portion of the resist film that a catalytic reaction of the acid cannot be sufficiently carried out. Therefore, solubility in a developer is spoiled at the bottom of the exposed portion of a positive resist film or insolubility in a developer is spoiled at the bottom of the exposed portion of a negative resist film. As a result, the positive resist pattern is in a defective footing shape and the negative resist pattern is in a defective undercut shape.

Accordingly, examination has been made on means for preventing the acid generated in the exposed portion of the resist film from being incorporated in the pores or the recesses of the underlying film. As a result, it has been found that when the underlying film is treated in a supercritical fluid, the surface of the underlying film is flattened, namely, the pores or the recesses of the underlying film are reduced, and therefore, the amount of acid incorporated in the underlying film can be reduced.

The present invention was devised on the basis of the aforementioned findings, and specifically, the pattern formation method of this invention includes the steps of treating, in a supercritical fluid, an underlying film that has pores or includes an organic material, whereby flattening a surface of the underlying film; forming a resist film made of a chemically amplified resist material on the underlying film whose surface has been flattened; performing pattern exposure by selectively irradiating the resist film with exposing light; and forming a resist pattern by developing the resist film after the pattern exposure.

The pores of the underlying film may be formed within or on the underlying film.

In the pattern formation method of this invention, after flattening the surface of the underlying film having pores or including an organic material through a treatment performed in a supercritical fluid, namely, after reducing pores or recesses on the underlying film, the resist film made of the chemically amplified resist material is formed on the underlying film. Therefore, an acid generated in an exposed portion of the resist film is minimally incorporated in the pores or the recesses of the underlying film. Accordingly, a catalytic reaction of the acid is not reduced at the bottom of the exposed portion of the resist film. As a result, a footing shape of a positive resist pattern and an undercut shape of a negative resist pattern can be suppressed, so as to form a resist pattern in a good cross-sectional shape.

In the pattern formation method of this invention, the chemically amplified resist material preferably contains, in a base polymer thereof, an acid labile group of an ester group (represented by Chemical Formula 1).

Chemical Formula 1:

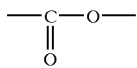

Thus, the resist film can be made stiff so as to attain a good pattern shape.

In this case, the ester group is preferably a t-butyl group, a t-butyloxycarbonyl group or an adamantyl group. Chemical Formula 2 below represents an ester group having a t-butyl group, Chemical Formula 3 represents an ester group having a t-butyloxycarbonyl group, and Chemical Formula 4 represents an ester group having an adamantyl group.

Chemical Formula 2:

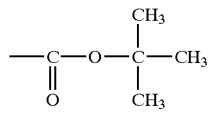

Chemical Formula 3:

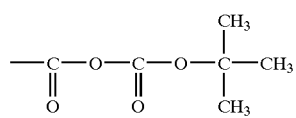

Chemical Formula 4:

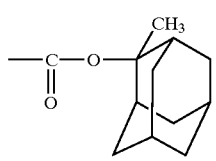

In the pattern formation method of this invention, the chemically amplified resist material preferably includes an acid generator composed of an imide compound.

An imide compound has a property that an anion and a cation generated through irradiation with exposing light approach each other, and therefore, the apparent size of the generated acid is larger than an acid generated from another acid generator. Therefore, the acid generated from an imide compound is minimally deactivated because it is difficult to be incorporated in the pores or recesses on the underlying film.

In this case, the imide compound is preferably benzeneimino tosylate, naphthaleneimino tosylate, benzeneimino triflate, naphthaleneimino triflate or phthalimino triflate. Chemical Formula 5 below represents benzeneimino tosylate (phthalimino tosylate), Chemical Formula 6 represents naphthaleneimino tosylate, Chemical Formula 7 represents benzeneimino triflate, Chemical Formula 8 represents naphthaleneimino triflate and Chemical Formula 9 represents phthalimino triflate.

Chemical Formula 5:

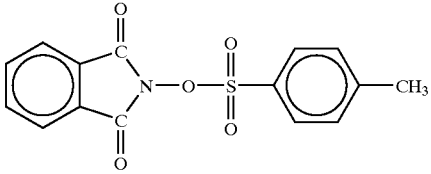

Chemical Formula 6:

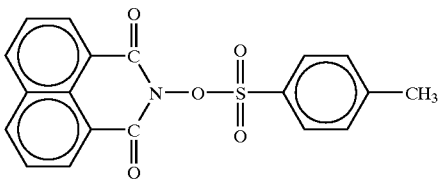

Chemical Formula 7:

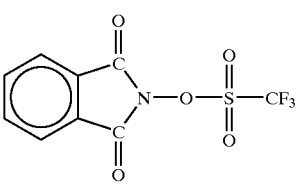

Chemical Formula 8:

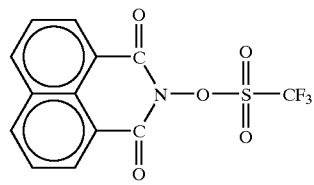

Chemical Formula 9:

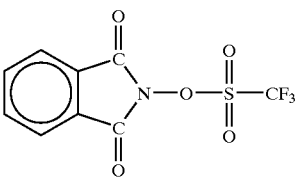

In the pattern formation method of this invention, the step of treating an underlying film in a supercritical fluid preferably includes, in the following order, sub-steps of flattening the surface of the underlying film in the supercritical fluid that is placed in a subcritical state by being kept at a temperature lower than a critical temperature and at a pressure higher than a critical pressure; changing the subcritical state of the supercritical fluid to a supercritical state by heating the supercritical fluid placed in the subcritical state; and restoring the supercritical state of the supercritical fluid to a general state by lowering a pressure of the supercritical fluid placed in the supercritical state.

When the underlying film is thus replaced with a supercritical fluid placed in a subcritical state, namely, a supercritical fluid with a high density, a material of convexes on the underlying film is rapidly replaced with the supercritical fluid placed in a subcritical state so as to be released from the surface of the underlying film. Therefore, the surface of the underlying film is rapidly flattened.

Also, since the supercritical fluid placed in a subcritical state that has been used for flattening the surface of the underlying film is changed to a supercritical fluid placed in a supercritical state by heating and then is restored to a fluid in a general state by reducing a pressure. Therefore, a supercritical fluid in a fluid state and a supercritical fluid in a gas state are never present at the same time, so that the surface treatment of the underlying film can be efficiently carried out.

In the pattern formation method of this invention, the step of treating an underlying film in a supercritical fluid preferably includes a sub-step of flattening the surface of the underlying film in the supercritical fluid that is placed in a supercritical state by being kept at a temperature higher than a critical temperature and at a pressure higher than a critical pressure.

Thus, the surface of the underlying film can be easily flattened.

In the pattern formation method of this invention, the supercritical fluid is preferably a supercritical fluid of carbon dioxide.

Thus, the supercritical fluid can be easily and definitely obtained.

In the pattern formation method of this invention, the supercritical fluid is preferably allowed to flow.

Thus, the surface material that has been replaced with the supercritical fluid and is dissolved in the supercritical fluid is discharged to the outside together with the flowing supercritical fluid, so that the surface of the underlying film can be efficiently flattened.

DETAILED DESCRIPTION OF THE INVENTION

Embodiment 1

Figure 1A:
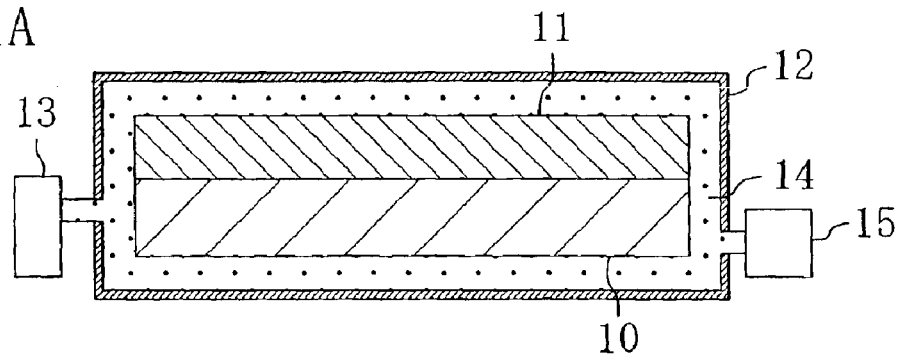
FIGS. 1A, 1B and 1C are cross-sectional views for showing procedures in a pattern formation method according to Embodiment 1 of the invention.

A pattern formation method according to Embodiment 1 of the invention will now be described with reference to FIGS. 1A through 1C, 2A and 2B.

First, an organic polymer made of aromatic hydrocarbon including no fluorine (for example, SILK manufactured by Hitachi Chemical Co., Ltd. (with a dielectric constant of 2.65)) is deposited on a substrate 10, so as to form a low dielectric insulating film 11 corresponding to an underlying film to be treated. Thus, the low dielectric insulating film 11 is made of an organic polymer, and therefore, the low dielectric insulating film 11 has a rough surface.

Then, the low dielectric insulating film 11 is placed in a chamber 12. Thereafter, a supercritical fluid 14 of carbon dioxide ($CO_2$) (which is placed in a supercritical state by being kept at a temperature of 40° C. and at 80 atmospheric pressure) is supplied from a cylinder 13 into the chamber 12 for 30 minutes, and the supercritical fluid 14 contained in the chamber 12 is discharged to the outside by a discharge pump 15. It is noted that the critical temperature of carbon dioxide is 31.0° C. and the critical pressure of carbon dioxide is 72.9 atmospheric pressure.

In this manner, a material of recesses of the rough surface of the low dielectric insulating film 11 is replaced with the supercritical fluid 14 and then is discharged to the outside of the chamber 12 together with the supercritical fluid 14, and therefore, the roughness on the surface of the low dielectric insulating film 11 is reduced. As a result, the recesses on the surface of the low dielectric insulating film 11 are reduced.

Thereafter, the low dielectric insulating film 11 whose surface has been flattened is moved to the outside of the chamber 12.

Furthermore, a positive chemically amplified resist material having the following composition is prepared:

| | |
|---|---:|
| Base polymer: poly((methoxymethyl acrylate) – (γ-butyrolactone methacrylate)) (wherein methoxymethyl acrylate:γ-butyrolactone methacrylate = 70 mol %:30 mol %) | 2 g |
| Acid generator: triphenylsulfonium triflate | 0.04 g |
| Solvent: propylene glycol monomethyl ether acetate | 20 g |

Figure 1B:
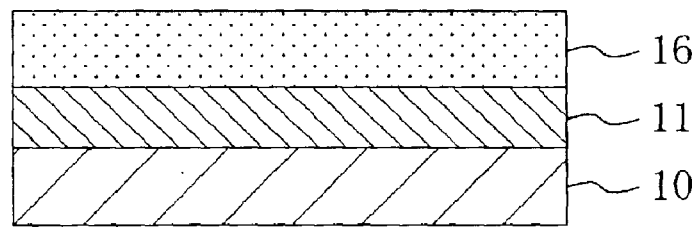

Next, as shown in FIG. 1B, the chemically amplified resist material having the aforementioned composition is applied on the low dielectric insulating film 11 whose surface has been flattened, and then, the resultant substrate 10 is annealed with a hot plate (not shown) at a temperature of 90° C. for 60 seconds. Thus, a resist film 16 with a thickness of 0.4 μm is formed.

Figure 1C:
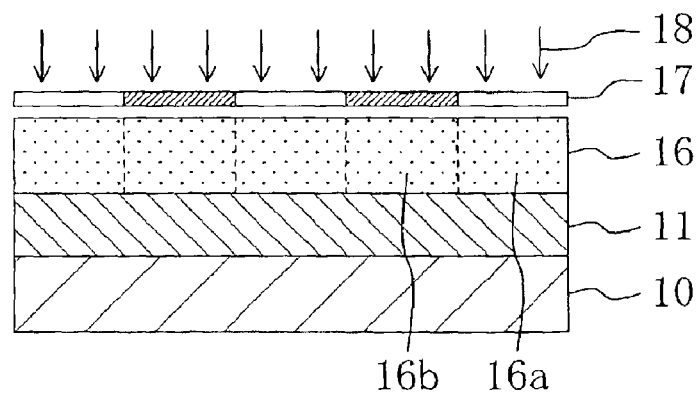

Then, as shown in FIG. 1C, pattern exposure is carried out by irradiating the resist film 16 with ArF excimer laser 18 emitted from an ArF excimer laser exposure machine with numerical aperture NA of 0.60 through a photomask 17 having a desired pattern.

Figure 2A:
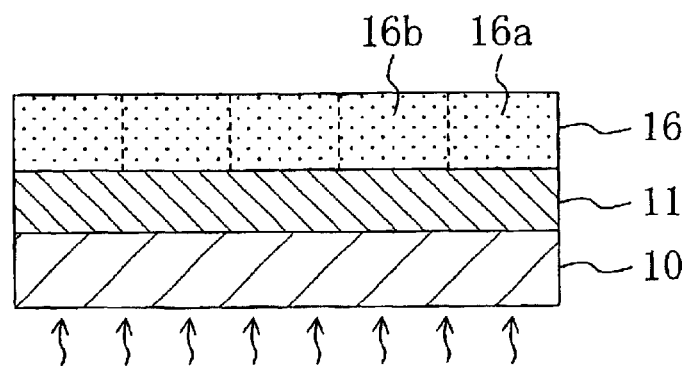
FIGS. 2A and 2B are cross-sectional views for showing other procedures in the pattern formation method of Embodiment 1.

Next, as shown in FIG. 2A, the resist film 16 is subjected to post-exposure bake (PEB) by annealing the substrate 10 with a hot plate (not shown) at a temperature of 105° C. for 90 seconds. Thus, an exposed portion 16a of the resist film 16 becomes soluble in an alkaline developer because an acid is generated from the acid generator therein while an unexposed portion 16b of the resist film 16 remains insoluble in an alkaline developer because no acid is generated from the acid generator therein.

As described above, since the recesses on the surface of the low dielectric insulating film 11 formed below the resist film 16 are reduced, the acid generated in the exposed portion 16a of the resist film 16 is minimally incorporated in the recesses on the surface of the low dielectric insulating film 11. Therefore, a catalytic reaction of the acid can be satisfactorily carried out in the exposed portion 16a of the resist film 16.

Figure 2B:
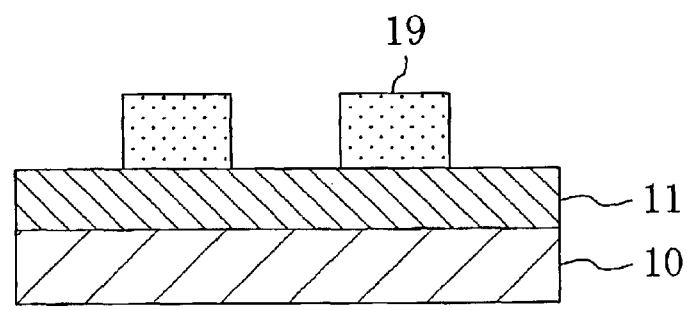

Next, after the pattern exposure, the resist film 16 is developed with an alkaline developer of a 2.38 wt % tetramethylammonium hydroxide aqueous solution for 60 seconds and then is rinsed with pure water for 60 seconds. Then, the resultant resist film 16 is dried. Thus, a resist pattern 19 with a pattern width of 0.11 μm is formed from the unexposed portion 16b of the resist film 16 as shown in FIG. 2B.

In this case, since the catalytic reaction of the acid is satisfactorily carried out in the exposed portion 16a of the resist film 16, the resist pattern 19 formed from the unexposed portion 16b of the resist film 16 can be in a good rectangular cross-sectional shape free from a footing shape.

In Embodiment 1, the surface treatment of the low dielectric insulating film 11 is performed in the supercritical fluid of carbon dioxide placed in a supercritical state. Instead, the surface treatment may be performed in a supercritical fluid of carbon dioxide placed in a subcritical state. This method will be now described with reference to FIG. 5.

First, the low dielectric insulating film 11 is held, for 40 seconds, in a supercritical fluid of carbon dioxide that is placed in a subcritical state by being kept at a temperature lower than the critical temperature (Tc), for example, at 28° C. and at a pressure higher than the critical pressure (Pc), for example, at 80 atmospheric pressure. Thus, the material of the recesses of the rough surface of the low dielectric insulating film 11 is replaced with the supercritical fluid of carbon dioxide in a subcritical state. In this case, the material of the recesses is efficiently replaced with the supercritical fluid that has a high density because of its subcritical state, and therefore, the recesses on the surface of the low dielectric insulating film 11 are rapidly reduced.

Next, the supercritical fluid of carbon dioxide in a subcritical state is heated to a temperature higher than the critical temperature (Tc), for example, to 40° C. while keeping the pressure higher than the critical pressure (Pc), thereby changing the subcritical state of the supercritical fluid to a supercritical state. Thereafter, while keeping the temperature higher than the supercritical temperature (Tc), the pressure higher than the supercritical pressure (Pc) is restored to the atmospheric pressure, thereby changing the supercritical state of the supercritical fluid to a subcritical state. Thereafter, the temperature higher than the supercritical temperature (Tc) is restored to the room temperature, so as to change the supercritical fluid placed in a subcritical state to a general fluid.

In this manner, it is possible to avoid a state where a supercritical fluid in a liquid state and a supercritical fluid in a gas state are present at the same time, and therefore, the surface treatment can be satisfactorily performed on the low dielectric insulating film 11.

Modification of Embodiment 1

A pattern formation method according to a modification of Embodiment 1 will now be described. This modification is different from Embodiment 1 in the chemically amplified resist material alone, and hence, the chemically amplified resist material alone will be herein described. Specifically, the chemically amplified resist material used in the modification has the following composition:

| | |
|---|---|
| Base polymer: poly((2-methyl-2-adamantyl acrylate) – (γ-butyrolactone methacrylate)) (wherein 2-methyl-2-adamantyl acrylate:γ-butyrolactone methacrylate = 70 mol %:30 mol %) | 2 g |
| Acid generator: naphthaleneimino tosylate | 0.04 g |
| Solvent: propylene glycol monomethyl ether acetate | 20 g |

In this chemically amplified resist material, the base polymer has an adamantyl group as an acid labile group of an ester group. Instead, the base polymer may have a t-butyl group or a t-butyloxycarbonyl group.

Also, in the chemically amplified resist material, naphthaleneimino tosylate is used as an acid generator made of an imide compound. Instead, the acid generator may be benzeneimino tosylate, benzeneimino triflate, naphthaleneimino triflate or phthalimino triflate.

Furthermore, although the acid labile group of an ester group and the acid generator made of an imide compound are both used in this modification, merely one of them may be used. Also in that case, a similar satisfactory effect can be attained.

Embodiment 2

A pattern formation method according to Embodiment 2 of the invention will now be described with reference to FIGS. 3A through 3C, 4A and 4B.

First, siloxane doped with carbon atoms (with a dielectric constant of 2.5) is deposited on a substrate 20, so as to form a low dielectric insulating film 21 corresponding to an underlying film to be treated. Thus, the low dielectric insulating film 21 is made of carbon-containing siloxane, and therefore, the low dielectric insulating film 21 has a rough surface.

Then, the low dielectric insulating film 21 is placed in a chamber 22. Thereafter, the low dielectric insulating film 21 is subjected to a surface flattening treatment with a supercritical fluid 23 of carbon dioxide ($CO_2$) (which is placed in a subcritical state by being kept at a temperature of 20° C. and at 80 atmospheric pressure) for 30 minutes.

In this manner, in the chamber 22, a material of recesses of the rough surface of the low dielectric insulating film 21 is efficiently replaced with the supercritical fluid that has a high density because of its subcritical state, and therefore, the recesses on the surface of the low dielectric insulating film 21 are rapidly reduced. Thereafter, the low dielectric insulating film 21 whose surface has been flattened is moved to the outside of the chamber 22.

Furthermore, a negative chemically amplified resist material having the following composition is prepared:

| | |
|---|---|
| Base polymer: poly(vinyl phenol) | 6 g |
| Crosslinking agent: 2,4,6-tris(methoxymethyl)amino-1,3,5-s-triazine | 0.12 g |
| Acid generator: phthalimino triflate | 0.02 g |
| Solvent: propylene glycol monomethyl ether acetate | 30 g |

Figure 3A:
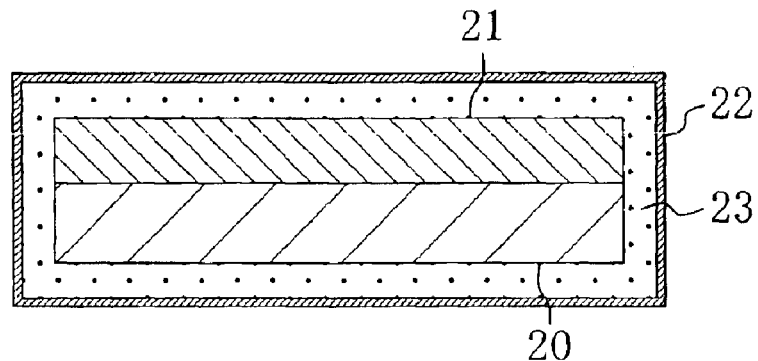
FIGS. 3A, 3B and 3C are cross-sectional views for showing procedures in a pattern formation method according to Embodiment 2 of the invention.
Figure 3B:
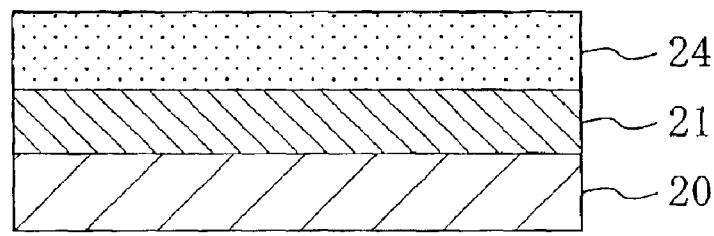

Next, as shown in FIG. 3B, the chemically amplified resist material having the aforementioned composition is applied on the low dielectric insulating film 21 whose surface has been flattened, and then, the resultant substrate 20 is annealed with a hot plate (not shown) at a temperature of 100° C. for 90 seconds. Thus, a resist film 24 with a thickness of 0.4 μm is formed.

Figure 3C:
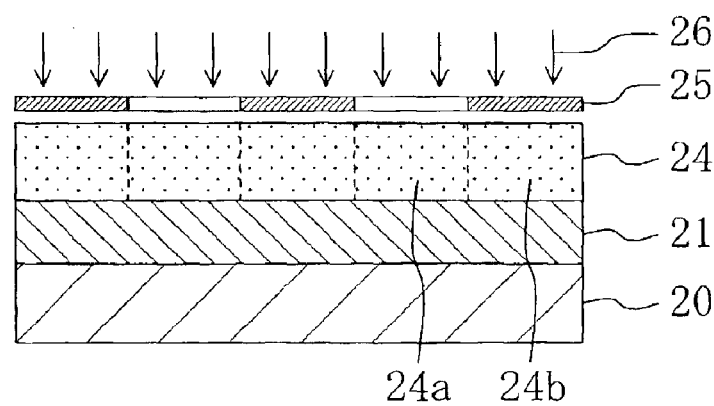

Then, as shown in FIG. 3C, pattern exposure is carried out by irradiating the resist film 24 with KrF excimer laser 26 emitted from a KrF excimer laser exposure machine with numerical aperture NA of 0.68 through a photomask 25 having a desired pattern.

Figure 4A:
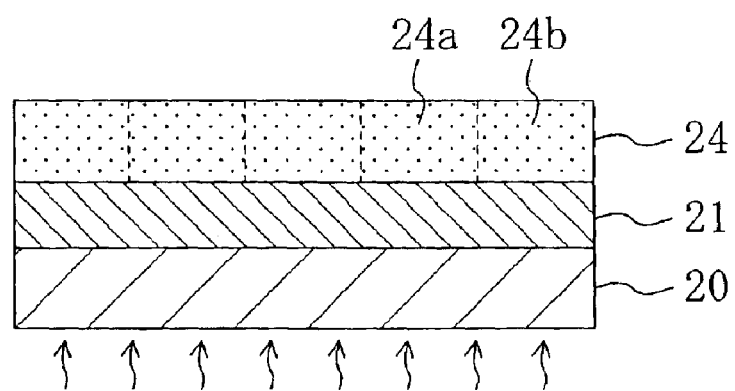
FIGS. 4A and 4B are cross-sectional views for showing other procedures in the pattern formation method of Embodiment 2.

Next, as shown in FIG. 4A, the resist film 24 is subjected to post-exposure bake (PEB) by annealing the substrate 20 with a hot plate (not shown) at a temperature of 120° C. for 90 seconds. Thus, an exposed portion 24a of the resist film 24 becomes insoluble in an alkaline developer because an acid is generated from the acid generator therein while an unexposed portion 24b of the resist film 24 remains soluble in an alkaline developer because no acid is generated from the acid generator therein.

As described above, since the recesses on the surface of the low dielectric insulating film 21 formed below the resist film 24 are reduced, the acid generated in the exposed portion 24a of the resist film 24 is minimally incorporated in the recesses on the surface of the low dielectric insulating film 21. Therefore, a catalytic reaction of the acid can be satisfactorily carried out in the exposed portion 24a of the resist film 24.

Figure 4B:
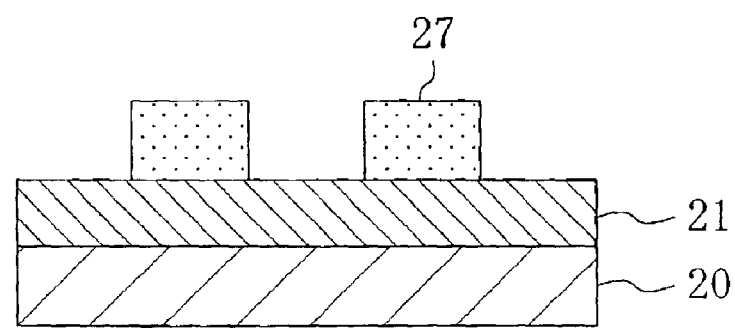

Next, after the pattern exposure, the resist film 24 is developed with an alkaline developer of a 2.38 wt % tetramethylammonium hydroxide aqueous solution for 60 seconds and then is rinsed with pure water for 60 seconds. Then, the resultant resist film 24 is dried. Thus, a resist pattern 27 with a pattern width of 0.12 μm is formed from the exposed portion 24a of the resist film 24 as shown in FIG. 4B.

In this case, since the catalytic reaction of the acid is satisfactorily carried out in the exposed portion 24a of the resist film 24, the resist pattern 27 formed from the exposed portion 24a of the resist film 24 can be in a good rectangular cross-sectional shape free from an undercut.

A supercritical fluid has a higher density at a lower temperature when the pressure is constant. Accordingly, when the surface treatment is performed in the supercritical fluid of carbon dioxide that is placed in a subcritical state by being kept at a temperature of 20° C. and at 80 atmospheric pressure as in Embodiment 2, the material of concaves of the rough surface of the low dielectric insulating film 21 is efficiently replaced with the supercritical fluid 23 in a subcritical state, and therefore, the surface treatment of the low dielectric insulating film 21 is rapidly carried out.

Preferably, as in Embodiment 1, the supercritical fluid of carbon dioxide placed in a subcritical state by being kept at a temperature lower than the critical temperature (Tc) and at a pressure higher than the critical pressure (Pc) is heated to a temperature higher than the critical temperature (Tc) while keeping the pressure higher than the critical pressure (Pc), so as to change the subcritical state of the supercritical fluid to a supercritical state, and thereafter, while keeping the temperature higher than the supercritical temperature (Tc), the pressure higher than the supercritical pressure (Pc) is restored to the atmospheric pressure, so as to change the supercritical state of the supercritical fluid to a subcritical state, and then, the temperature higher than the supercritical temperature (Tc) is restored to the room temperature, so as to change the supercritical fluid placed in a subcritical state to a general fluid.

Figure 5:
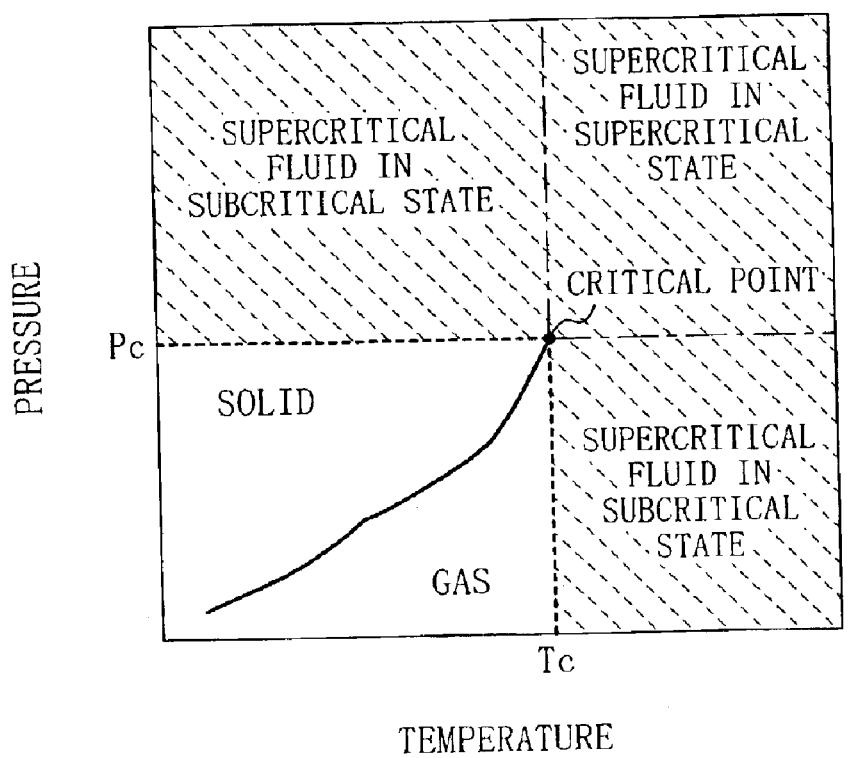
FIG. 5 is a diagram for explaining respective states of a supercritical fluid.
Figure 6A:
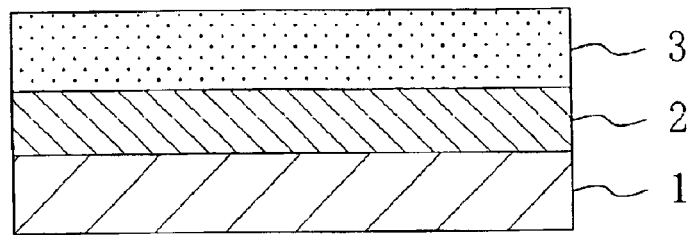
FIGS. 6A, 6B, 6C and 6D are cross-sectional views for showing procedures in a conventional pattern formation method.
Figure 6B:
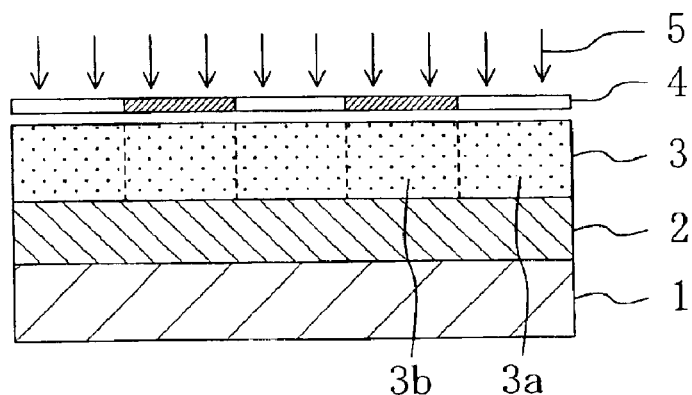
Figure 6C:
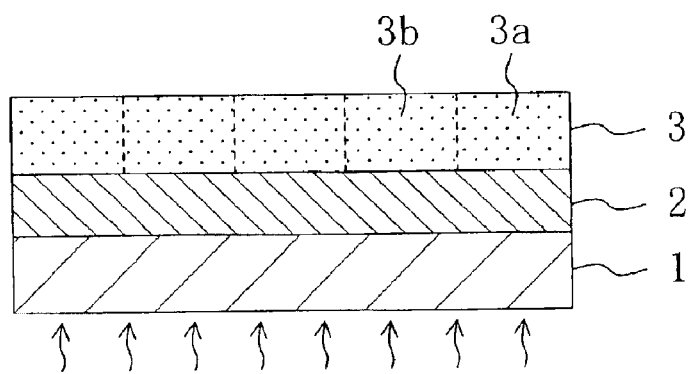
Figure 6D:
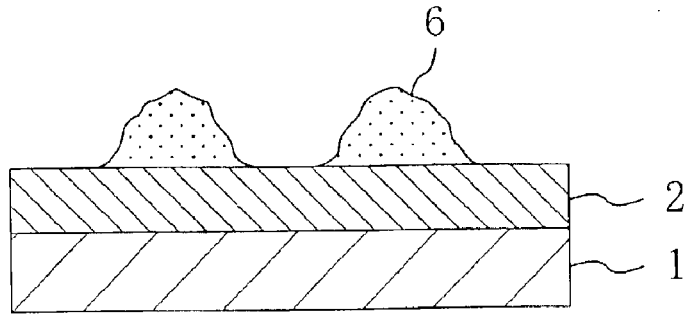

In this manner, it is possible to avoid a state where a supercritical fluid in a liquid state and a supercritical fluid in a gas state are present at the same time as shown in FIG. 5, and therefore, the surface treatment can be satisfactorily performed on the low dielectric insulating film 21.

Although carbon dioxide is singly used as the supercritical fluid in Embodiments 1 and 2, a small amount of organic solvent such as alcohol, hydrocarbon, ether or carboxylic acid, may be added to carbon dioxide as an entrainer. Thus, the replacement of alcohol with the supercritical fluid is accelerated.

Also, although the supercritical fluid of carbon dioxide (with a critical temperature of 31.0° C. and a critical pressure of 72.9 atmospheric pressure) is used in Embodiments 1 and 2, a supercritical fluid of water ($H_2O$) (with a critical temperature of 374.2° C. and a critical pressure of 218.3 atmospheric pressure) or a supercritical fluid of ammonia ($NH_3$) (with a critical temperature of 132.3° C. and a critical pressure of 111.3 atmospheric pressure) may be used instead. However, carbon dioxide can be easily placed in a supercritical state because its critical temperature and critical pressure are lower than those of the other fluids.

What is claimed is:

1. A pattern formation method comprising the steps of:
    treating, in a supercritical fluid, an underlying film that has pores or includes an organic material, whereby flattening a surface of said underlying film;
    forming a resist film made of a chemically amplified resist material on said underlying film whose surface has been flattened;
    performing pattern exposure by selectively irradiating said resist film with exposing light; and
    forming a resist pattern by developing said resist film after the pattern exposure.

2. The pattern formation method of claim 1,
    wherein said chemically amplified resist material contains, in a base polymer thereof, an acid labile group of an ester group.

3. The pattern formation method of claim 2,
    wherein said ester group is a t-butyl group, a t-butyloxycarbonyl group or an adamantyl group.

4. The pattern formation method of claim 1,
    wherein said chemically amplified resist material includes an acid generator composed of an imide compound.

5. The pattern formation method of claim 4,
    wherein said imide compound is benzeneimino tosylate, naphthaleneimino tosylate, benzeneimino triflate, naphthaleneimino triflate or phthalimino triflate.

6. The pattern formation method of claim 1,
    wherein the step of treating an underlying film in a supercritical fluid includes, in the following order, sub-steps of:
    flattening the surface of said underlying film in said supercritical fluid that is placed in a subcritical state by being kept at a temperature lower than a critical temperature and at a pressure higher than a critical pressure;
    changing the subcritical state of said supercritical fluid to a supercritical state by heating said supercritical fluid placed in the subcritical state; and
    restoring the supercritical state of said supercritical fluid to a general state by lowering a pressure of said supercritical fluid placed in the supercritical state.

7. The pattern formation method of claim 1,
    wherein the step of treating an underlying film in a supercritical fluid includes a sub-step of flattening the surface of said underlying film in said supercritical fluid that is placed in a supercritical state by being kept at a temperature higher than a critical temperature and at a pressure higher than a critical pressure.

8. The pattern formation method of claim 1,
    wherein said supercritical fluid is a supercritical fluid of carbon dioxide, $H_2O$, or $NH_3$.

9. The pattern formation method of claim 1,
    wherein said supercritical fluid is allowed to flow.

10. A pattern formation method comprising the steps of:
    forming an insulating film including pores or an organic material over a substrate;
    providing a supercritical fluid on a surface of said insulating film;
    forming a chemical amplified resist film on said insulating film;
    performing pattern exposure by selectively irradiating said resist film with exposing light; and
    forming a resist pattern by developing said resist film after the pattern exposure.

11. The pattern formation method of claim 10, wherein said insulating film has a lower dielectric constant than silicon dioxide film.

12. The pattern formation method of claim 10, wherein a dielectric constant of said insulating film is 2.65 or less.

13. The pattern formation method of claim 10, wherein said insulating film includes an organic polymer made of aromatic hydrocarbon.

14. The pattern formation method of claim 10, wherein said surface of said insulating film is flattened after providing said supercritical fluid and before forming a chemical amplified resist film.

15. The pattern formation method of claim 10,
wherein the step of providing a supercritical fluid on a surface of said insulating film includes, in the following order, sub-steps of:
flattening the surface of said insulating film in said supercritical fluid that is placed in a subcritical state by being kept at a temperature lower than a critical temperature and at a pressure higher than a critical pressure;
shifting the subcritical state of said supereritical fluid to a supercritical state by heating said supercritical fluid placed in the subcritical state; and
restoring the supereritical state of said supercritical fluid to a general state by lowering a pressure of said supercritical fluid placed in the supercritical state.

16. The pattern formation method of claim 10,
wherein said chemically amplified resist material contains, in a base polymer thereof, an acid labile group having an ester group selected from a t-butyl group, a t-butyloxycarbonyl group or an adamantyl group.

17. A pattern formation method comprising the steps of:
forming an insulating film including pores or an organic material over a substrate;
exposing a surface of said insulating film by a supercritical fluid;
forming a chemical amplified resist film on said insulating film;
performing pattern exposure by selectively irradiating said resist film with exposing light; and
forming a resist pattern by developing said resist film after the pattern exposure.

18. The pattern formation method of claim 17, wherein pores or recesses of said surface of said insulating film is reduced after exposing a surface of said insulating film by a supercritical fluid.

19. The pattern formation method of claim 17, wherein said insulating film includes an organic polymer made of aromatic hydrocarbon.

20. The pattern formation method of claim 17,
wherein said exposing light is KrF excimer laser or ArF excimer laser.

* * * * *